US006309966B1

(12) United States Patent
Govindarajan et al.

(10) Patent No.: US 6,309,966 B1
(45) Date of Patent: Oct. 30, 2001

(54) APPARATUS AND METHOD OF A LOW PRESSURE, TWO-STEP NUCLEATION TUNGSTEN DEPOSITION

(75) Inventors: Shrinivas Govindarajan, Glen Allen, VA (US); Anthony Ciancio, Gilbert, AZ (US)

(73) Assignees: Motorola, Inc., Schaumburg, IL (US); White Oak Semiconductor Partnership, Sandston, VA (US)

( * ) Notice: Subject to any disclaimer, the term of this patent is extended or adjusted under 35 U.S.C. 154(b) by 0 days.

(21) Appl. No.: 09/639,183

(22) Filed: Aug. 15, 2000

Related U.S. Application Data

(60) Provisional application No. 60/152,407, filed on Sep. 3, 1999.

(51) Int. Cl.[7] ..................................................... H01L 21/44

(52) U.S. Cl. ........................ 438/656; 438/685; 438/654; 438/655; 438/658

(58) Field of Search ................................. 438/685, 652, 438/654, 655, 656, 658

(56) References Cited

U.S. PATENT DOCUMENTS

| 5,489,552 | * | 2/1996 | Merchant et al. . | |
| 5,661,080 | * | 8/1997 | Hwang et al. | 438/654 |
| 5,795,824 | * | 8/1998 | Hancock | 438/656 |
| 5,956,609 | * | 9/1999 | Lee et al. | 438/627 |

FOREIGN PATENT DOCUMENTS

WO 99/28527 * 6/1999 (WO) .

OTHER PUBLICATIONS

Broadbent, "Nucleation and growth of chemically vapor deposited tungsten on various substrate materials: A review," *J. Vac. Sci. Technol.*, B 5(6):1161–1666, Nov./Dec. 1987.

Broadbent and Stacy, "Selective tungsten processing by low pressure CVD," *Solid State Technology*, pp. 51–59, Dec. 1985.

Clark, "Response surface modeling of high pressure chemical vapor deposited blanket tungsten," *J. Vac. Sci. Technol.*, B 9(3):1478–1486, May/Jun. 1991.

Kim et al., "Studies on the nucleation and growth of chemical–vapor–deposited W on TiN substrates," *Materials Science and Engineering*, B17:1377–142, 1993.

Riley and Clark, "Integrated chemical vapor deposition and plasma etchback of tungsten in a multichamber, single–wafer system," *J. Electrochem. Soc.*, 138(10):3008–3013, Oct. 1991.

(List continued on next page.)

Primary Examiner—Trung Dang
(74) Attorney, Agent, or Firm—Akin, Gump, Strauss, Hauer & Feld, L.L.P.

(57) ABSTRACT

An apparatus and method of tungsten via fill using a low pressure, 2-step nucleation tungsten deposition process. The tungsten via fill includes a silane soak, a nucleation film growth, and a bulk tungsten film deposition. The nucleation film growth is a low pressure, 2-step process including a controlled first nucleation film growth and a second nucleation film growth. A wafer fabricating system that includes a film depositing system and a control system is used. The film depositing system includes a reaction chamber with at least one silane-containing gas source, a tungsten-containing gas source, and a substrate heating source. The control system instructs the silane-containing gas source and the tungsten-containing gas source to flow with a significantly higher ratio of silane-containing gas ($SiH_4$) to form a first silane-rich nucleation layer. The control system then instructs the gas sources to flow with a higher ratio of tungsten-containing gas, such as $WF_6$, to form a second tungsten nucleation layer. The low pressure, 2-step process results with improved nucleation film step coverage.

10 Claims, 4 Drawing Sheets

OTHER PUBLICATIONS

Schmitz, "Chemical vapor deposition of tungsten and tungsten silicides for VLSI/ULSI applications," Noyes Publications, Park Ridge, New Jersey, 1992.

Wells, "Tungsten and other refractory metals for VLSI applications III," *Proceedings of the 1987 Workshop*, IBM Thomas J. Watson Research Center, Yorktown Heights, New York, U.S.A., pp. 209–216, Oct. 7–9, 1987.

* cited by examiner

APPARATUS AND METHOD OF A LOW PRESSURE, TWO-STEP NUCLEATION TUNGSTEN DEPOSITION

CROSS-REFERENCE TO RELATED APPLICATIONS

This application claims the benefit of U.S. Provisional Application Serial No. 60/152,407 filed Sep. 3, 1999, which is hereby incorporated by reference, including all drawings and appendices, as if set forth in its entirety.

FIELD OF THE INVENTION

The present invention relates generally to the fabrication of semiconductor devices; and, more particularly, to a method of achieving superior via fill.

BACKGROUND OF THE INVENTION

As the semiconductor industry continues to increase the density of devices manufacturable on a semiconductor substrate, the device features continue to shrink below the quarter-micron size. The critical dimensions of vias between different metal layers are decreased, making it more difficult to achieve void-free via fill as the stringent restrictions on the pitch and space results in straight-walled vias with high aspect ratios. The problem of having voids become apparent after a chemical mechanical planarization (CMP) step followed by a subsequent wet chemical cleaning step. The voids can potentially open up a pathway for fluids to become entrapped within the via.

A tungsten via fill process that is commonly known to those skilled in the art typically consists of two important film deposition steps. The two film deposition steps include a nucleation step and a bulk film deposition step. The nucleation step is typically associated with poor step coverage, which may eventually lead to voiding (due to premature closure of the via) and increased surface roughness. Further, the nucleation step is unstable with a commonly known process having a 1:1 gas flow rate ratio of tungsten hexafluoride ($WF_6$) and silane ($SiH_4$) at a certain pressure regimes, such as approximately 20 to 40 torr. Within this regime, the nucleation step is sensitive to the precision of the actual gas flow rates, especially during the initial stages of nucleation. Mass flow controllers (MFCs), are used to regulate the gas flow rate for a silane gas source and a tungsten gas source. The response times of the MFCs affect the nucleation film. For example, if the MFC for the tungsten gas source responds quicker than the MFC from the silane gas source, the film exhibits localized thinning near the center of the wafer. The currently known process, as a result, requires precise adjustment of the MFCs to achieve accurate gas flow rates. Further, a process with a pressure such as 30 torr, is more susceptible to gas phase nucleation (GPN).

Prior to the tungsten via fill process, a titanium nitride (TiN) film is reactively sputtered on the via sidewalls to act as a "glue" liner for the tungsten via fill. Alternative methods to deposit the "glue" liner include chemical vapor deposition or a combination of chemical and physical vapor deposition. The mechanism of the sputtering process is generally a line-of-sight process; therefore, the top area of the via is exposed more to the reactive species than the bottom of the via. The resulting profile includes an "overhang" at the top of the via as illustrated in FIG. 1. A via 100 comprises two sidewalls 102 and a TiN liner 103 with an "overhang" 104. The overhang 104 affects the nucleation film as the depos-iting tungsten generally grows away from the surface. In other words, the tungsten nucleation film growth is in a direction perpendicular to the surface of the sidewalls. As a result, the tungsten nucleation film will grow conforming to the existing overhang 104 from the TiN liner 103 and the top area of the via will close prematurely, creating a void.

The uniformity of a deposited film in patterned features like a trench or a via (such as the TiN liner 103) is referred to as "step coverage". The step coverage is typically determined by taking a ratio of the maximum thickness and the minimum thickness and converting the value to a percentage. By way of example, a 60% step coverage of the TiN liner 103 may indicate a maximum thickness of about 10 nanometers (nm) at the top of a via and a minimum thickness of about 6 nm at the bottom of the via sidewall. Ideally, the goal is to have 100% step coverage for a TiN liner deposition. As straight-sidewalls and high aspect ratios of the vias accompany the decreasing dimensions of integrated circuits, the problem of the step coverage for a TiN liner, such as the TiN liner 103 of FIG. 1, is increased. Substantial thinning of a TiN liner near the bottom of via sidewall is evident and illustrated with the TiN liner 103 of FIG. 1. The poor step coverage in the TiN liner 103, in turn, results in poor step coverage of the tungsten nucleation film. It is also conceivable that non-uniformity during the via etch process can result in areas without any liner coverage. The absence of any liner coverage reduces the growth rate of the tungsten nucleation film.

Solutions to resolve the voiding problem include varying the tungsten film chemistry, the tungsten nucleation film thickness, and the TiN liner thickness. The TiN liner thickness in comparison with the tungsten nucleation film thickness, however, is almost negligible. Typically, the liner thickness is about 10 nm and the tungsten nucleation film thickness is about 100 nm. The overhang profile created during the TiN liner deposition, therefore, is more pronounced after forming the tungsten nucleation film. By increasing the tungsten nucleation film thickness, the step coverage becomes worse as the overhang profile from the TiN liner is more pronounced. Depositing a tungsten nucleation film with a thickness that is too thin, on the other hand, forms a by-product called hydrogen fluoride (HF) which attacks the TiN liner and creates defects known as "woil holes" that results when the $WF_6$ gas contacts the silicon. It is desired to fabricate semiconductor devices using reliable and robust processing methods to improve the tungsten fill characteristics for vias with high aspect ratios as the device structures continue to scale down below the quarter micron size.

BRIEF DESCRIPTION OF THE DRAWINGS

A better understanding of the present invention can be obtained when the following detailed description of an exemplary embodiment is considered in conjunction with the following drawings, in which.

DETAILED DESCRIPTION OF THE INVENTION

The present invention provides an apparatus and method of depositing a tungsten film including a controlled first nucleation film growth and a second nucleation film growth. The first nucleation film growth includes a first silane-rich nucleation (or "seed") layer achieved by flowing a significantly higher ratio of silane-containing gas and the second nucleation film growth includes a second tungsten nucleation layer by flowing a higher ratio of tungsten-containing gas. Having the first and second nucleation film growths result in uniform step coverage of a nucleation film and provides process stability as the sensitivity associated with MFC response time is eliminated. The potential for gas phase nucleation is also minimized as the deposition occurs at a lower pressure regime. In addition, contact resistance and chain contact resistance is reduced significantly.

Figure 1:
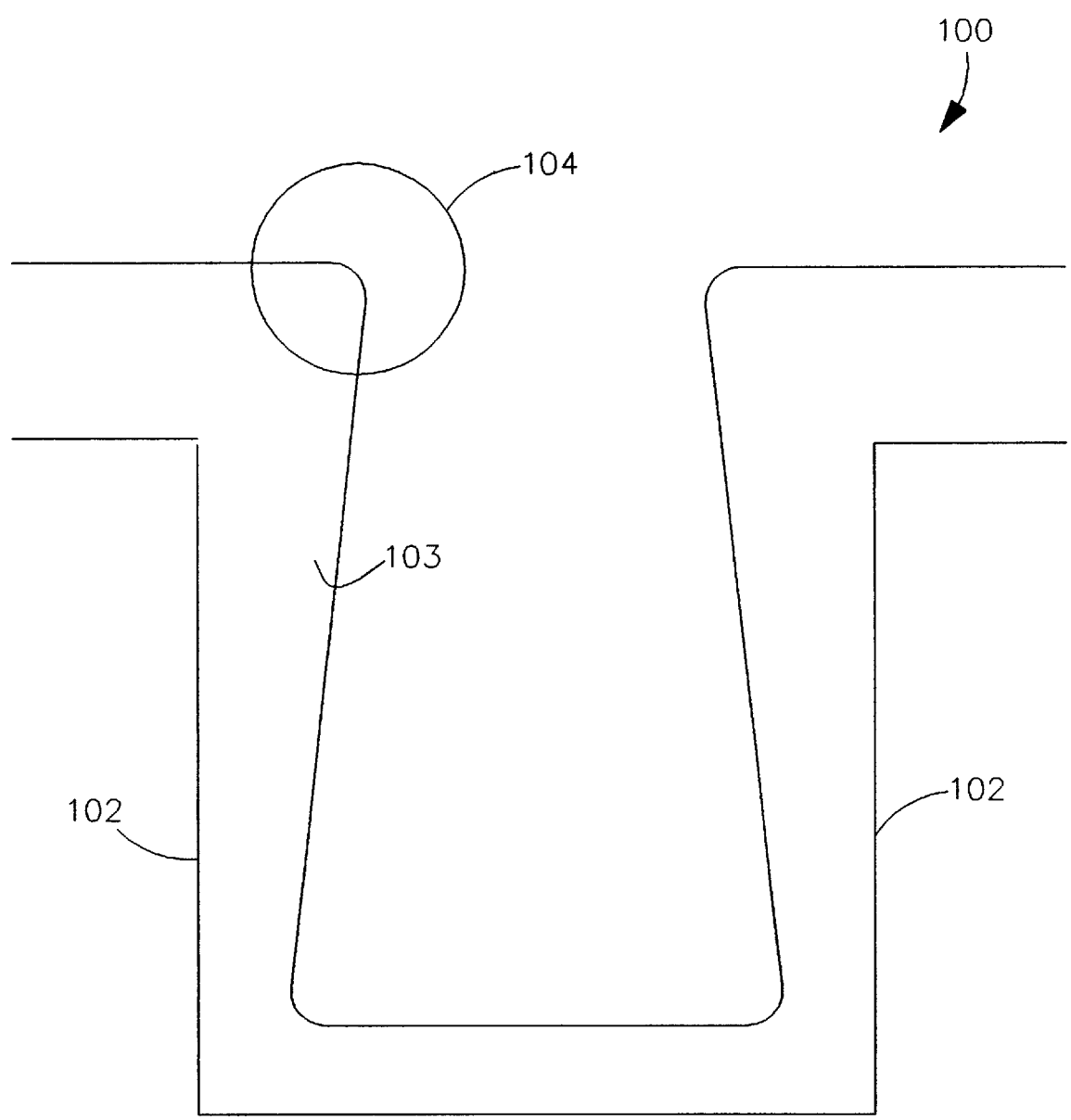
FIG. 1 is a cross-section view of a via including a TiN liner with an overhang profile, that is commonly known to those skilled in the art.
Figure 2:
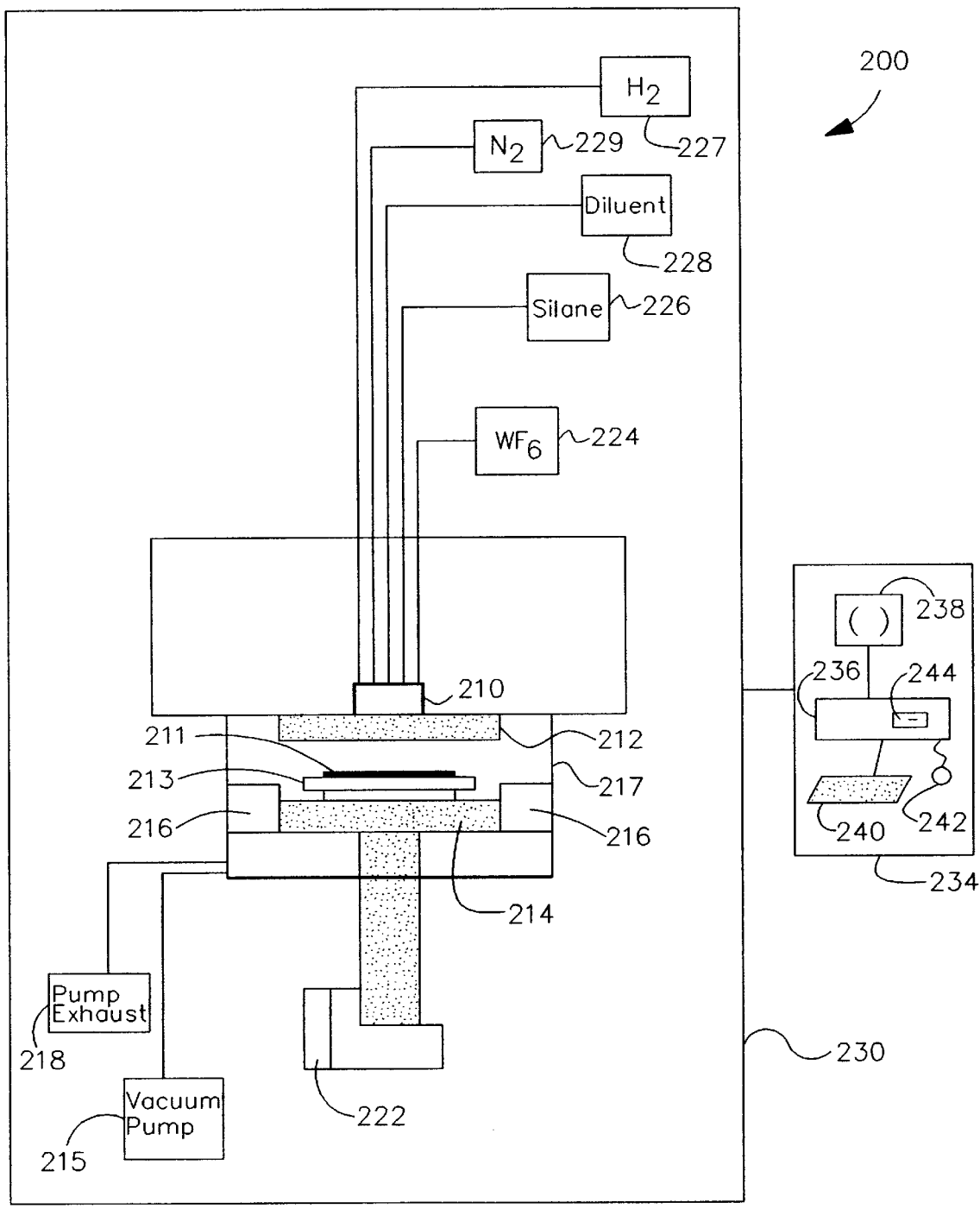
FIG. 2 is a block diagram illustrating an exemplary wafer processing system according to an embodiment of the present invention.

FIG. 2 is a block diagram illustrating an exemplary embodiment of a wafer fabricating system 200 comprising a film depositing system 230 coupled to a control system 234. The film depositing system 230 further comprises a reaction chamber 217 coupled to a pump exhaust 218 and a vacuum pump 215. Interior to the reaction chamber 217 is a gas mixing block 210 that is connected to a showerhead 212, and a substrate heating source 214. In one embodiment, the substrate heating source 214 is a resistive heater. The substrate heating source 214 may also be a radio frequency (RF) power generator or an infrared lamp source. The ends of the substrate heating source 214 arc capped with ceramic liners 216 which prevent the gas species from flowing under the substrate heating source 214 and contains the gas species within the reaction chamber 217.

For this particular embodiment, a substrate 211 rests upon the substrate heating source 214 during the film deposition process. An argon gas source 225 coupled to the substrate heating source 214 controls the pressure interfacing the backside of the substrate 211 (backside pressure). The backside pressure is less than the pressure in the reaction chamber 217 allowing the substrate 211 to be held in place. In another embodiment, a wafer susceptor is placed closely above the substrate heating source 214. In this case, the substrate 211 rests on top of the water susceptor. The substrate 211 may be a semiconductor substrate of silicon or a wafer including multiple devices. A robotic lift 222 is used to control the up and down motion of the substrate heating source 214 in order to place the substrate 211 in or out of the reaction chamber 217.

The reaction chamber 217 should be capable of withstanding corrosive gases such as HF, $WF_6$, or titanium tetrachloride ($TiCl_4$). For this particular embodiment, the film depositing system 230 comprises a tungsten-containing gas source 224 and a silane-containing gas source 226, each interfacing the gas mixing block 210 that, in turn, introduces the gas mixture into the reaction chamber 217. In a more specific embodiment, the tungsten-containing gas source 224 is $WF_6$ and the silane-containing gas source 226 is $SiH_4$. Also connected to the gas mixing block 210 is a diluent gas source 228 and two gas sources 227 and 229, which may include hydrogen ($H_2$) and nitrogen ($N_2$), respectively. In one embodiment, the diluent gas source 228 and the gas source ($H_2$) 227 are further connected to the substrate heating source 214 to provide an edge purge at the surface interfacing the substrate 211.

The general mechanism of depositing a tungsten film includes creating a nucleation film (nucleation film growth) and depositing a bulk layer (bulk tungsten film deposition) by introducing a given composition of a gas mixture into a reaction chamber. In particular, a gas mixture from the tungsten-containing gas source 224 and the silane-containing gas source 226 is fed through the gas mixing block 210 and into the reaction chamber 217. The gas mixture from the gas mixing block 210 is distributed through the showerhead 212. The gas mixture then moves to the substrate 211 where the reactants are absorbed on the surface. The absorbed atoms undergo migration and film forming chemical reactions. The resulting gaseous by-products of the reaction are desorbed and removed from the reaction chamber 217 through the pump exhaust 218.

the energy to drive the reactions can be supplied by several methods (such as thermal, photons or electrons), in which thermal energy is the most commonly used. For this particular embodiment, the substrate 211 is heated using the substrate heating source 214. The substrate heating source 214 enhances the surface reaction of a depositing surface in the substrate 211 during the nucleation film growth and the bulk tungsten deposition. In another embodiment, the wafer substrate 211 can be heated using radio frequency (RF) induction heating, photons, energy from a plasma or energy from infrared lamps.

The reactant gases are carried by diluent gases supplied from a gas source such as the diluent gas source 228 in the film depositing system 230. The diluent gases enhance the uniformity of the tungsten film and may be inert gases. In one embodiment, the diluent gas source 228 is argon (Ar). Other already disclosed gases that could be used as the diluent gas include $H_2$ or $N_2$. The gas source ($H_2$) 227 is integral during the bulk tungsten deposition and the gas source ($N_2$) 229 is important in controlling the grain size of the depositing film throughout the overall film deposition process, including the nucleation film growth.

In one embodiment, the diluent gas source 228 and the gas source ($H_2$) 227 are introduced from the substrate heating source 214 to provide an edge purge at the surface interfacing the substrate 211. The edge purge allows controllability in uniformity of the overall tungsten film. For example, by increasing the argon flow, the tungsten film thickness is thinner around the edge of the substrate 211 than the center. On the other hand, the tungsten film thickness is greater around the edge of the substrate 211 when increasing the hydrogen flow.

The control system 234 may consist of one or more input devices that allow an operator to enter a set of conditions known as a process "recipe" needed to achieve the desired deposition process. The control system 234 may include, for example, a monitor, a touch screen, and related control circuitry that enable an operator to manually enter a recipe for execution by the control circuitry. In a more specific embodiment, the control system 234 can include a computer 236 and related input/output devices coupled thereto, such as a monitor 238, a keyboard 240, a mouse 242, and one or more storage devices 244. The storage devices 244 may include any one or any combination of floppy disc drives, hard disc drives, CD-ROM drives, tape drives, etc. The computer 236 typically includes a processor and memory, such as any combination of read-only memory (ROM), random access memory (RAM), etc. The computer 236 employs an application program that receives and executes each recipe to control the reaction chamber 217 and its included components. The recipe may comprise a set of instructions in the form of a software program or the like so that one or more such recipes may be created and stored on the storage device 244.

Figure 3:
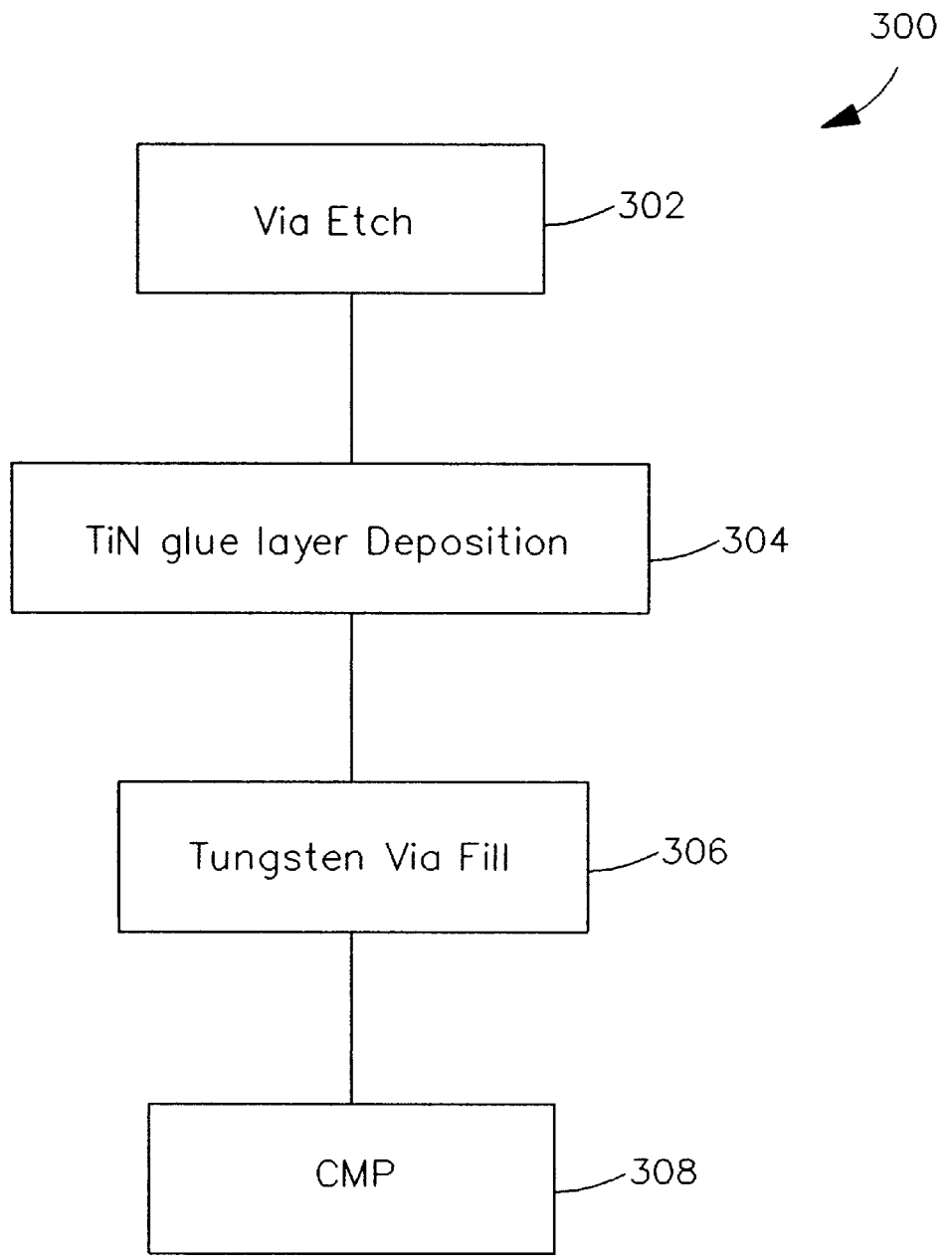
FIG. 3 is a flow chart illustrating an exemplary application in a wafer fabrication sequence according to an embodiment of the present invention.

FIG. 3 is a flow chart illustrating an exemplary application in a wafer fabrication sequence according to an embodiment of the present invention. The flow chart 300 illustrates a wafer fabrication sequence comprising a via etch in block 302 in which vias are formed within the semiconductor substrate or wafer to connect one layer of metal to another layer of metal. In a separate processing tool, a TiN glue liner is deposited onto the sidewalls and at the bottom of the vias during the TiN deposition in block 304. The TiN liner acts as an adhesive for a tungsten via fill performed in a different processing tool in the following block 306. A tungsten material is generally used to fill a via because of its low resistivity. Accordingly, a chemical mechanical planarization (CMP) block 312 is performed to planarize the tungsten via fill.

Figure 4:
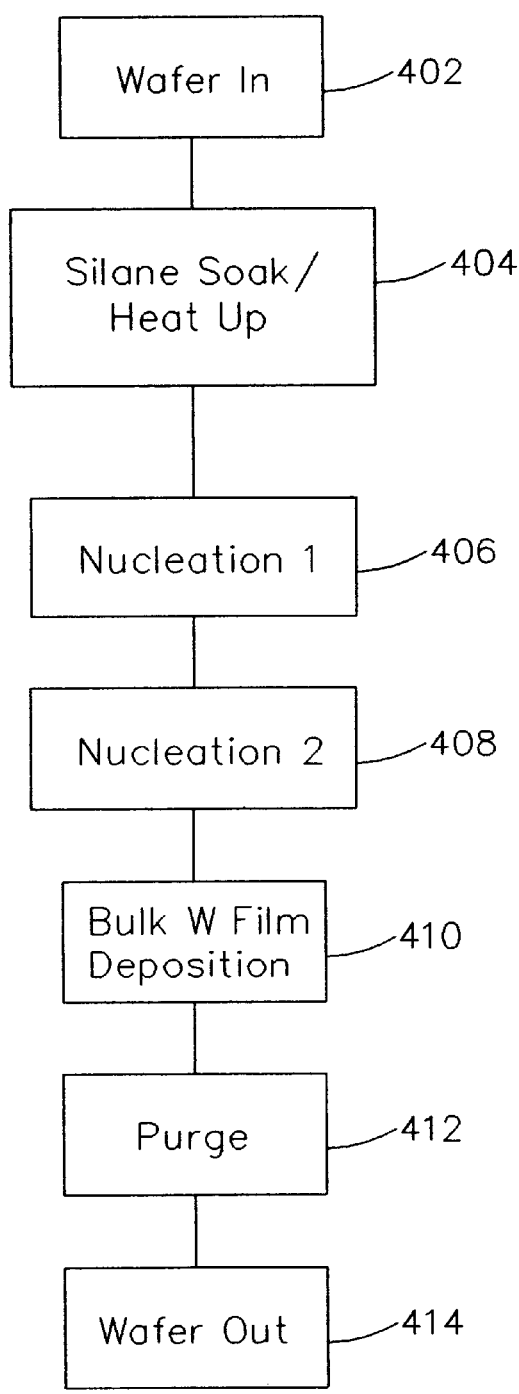
FIG. 4 is a flow chart illustrating an exemplary tungsten via fill process including a 2-step nucleation film growth according to an embodiment of the present invention.

FIG. 4 is a flow chart that further illustrates an exemplary tungsten film deposition process recipe for the tungsten via fill in block 306 including a 2-step nucleation film growth according to the present invention. Generally speaking, the process recipe includes executing a first nucleation film growth and a second nucleation film growth to foil a nucleation film preceding the bulk tungsten film deposition. The exemplary tungsten film deposition process recipe including the first and second nucleation growths subsequently followed by the bulk tungsten film deposition, may be performed using a single processing tool. For example, the tungsten via fill in block 306 can be achieved performing the tungsten film deposition process recipe in an embodiment similar to the wafer fabricating system 200 described previously. In accordance with this particular embodiment, the substrate 211 is loaded into the reaction chamber 217 by first placing the substrate 211 on the substrate heating source 214 in block 402. The control system 234 then instructs the robotic lift 222 to raise the substrate heating source 214 so that the distance from the substrate heating source 214 and the showerhead 212 is at a value within the range of about 375 milli inch (mils) and 425 mils. The substrate heating source 214 is then prompted to heat the substrate 211 at a temperature within the range of approximately 400 degrees Celsius and 450 degrees Celsius in block 404. Both the spacing and the temperature of the substrate heating Source 214 are maintained throughout the tungsten film deposition process.

In the same block 404, the control system 234 instructs the diluent gas source 228, the gas source ($N_2$) 229, and the silane-containing gas source 226 to flow a sufficient amount of a silicide gas mixture comprising argon, nitrogen, and silane for a "silane soak." The silane soak enhances the tungsten film uniformity by forming a very thin, protective layer of amorphous silicon on the surface upon which the tungsten film is to be deposited. The protective layer promotes the adhesion of the tungsten film. For this particular embodiment, the silane soak is performed by applying pressure and sequentially ramping the pressure from approximately 4.5 torr to approximately 10 torr to approximately 30 torr. In one embodiment, the pressure is ramped during a period of time on the order of approximately 15 to 20 seconds. In particular, the pressure is ramped over three equivalent time segments such as 5 seconds each. By ramping the pressure, the wafer chucking capability is improved.

A first nucleation film growth is performed in block 406 by flowing silane gas from a silane containing gas source 226 at a first flow rate, and tungsten gas from a tungsten-containing gas source 224 at the second flow rate, where the first flow rate is significantly greater than the second flow rate, and for a period of time sufficient to provide a first silane-rich nucleation layer. In one embodiment, the period of time to provide a first silane-rich nucleation layer is approximately 5 seconds.

The control system 234 instructs the tungsten-containing gas source 224 and the silane-containing gas source 226 to flow a sufficient amount of gas mixture that results in a first silane-rich nucleation site layer that acts as a "seed" layer for the subsequent second nucleation film growth and the bulk tungsten film deposition. It is conceivable that the "seed" layer nucleates uniformly on all the surfaces within the via and, therefore, covers up any region or location devoid of the TiN glue liner, such as the bottom corners of a via.

In one embodiment, the gas flow rate ratio of the first flow rate and the second flow rate is within the range of approximately 2:1 to 7:1. More specifically, the control system 234 instructs the silane-containing gas source 226 and the tungsten-containing gas source 224 to flow $SiH_4$ and $WF_6$ at a ratio within the range of approximately 2:1 to 7:1. By way of example, the tungsten-containing gas source 224 is prompted to flow $WF_6$ gas at a rate within the range of approximately 5 to 10 standard cubic centimeter per minute (sccm). Meanwhile, the silane-containing gas source 226 allows the $SiH_4$ gas to flow at a rate within the range of approximately 27 to 33 sccm.

The control system 234 further instructs the diluent as source 228 to flow a sufficient amount of diluent gas in order to enhance uniformity across the substrate 211. In this particular embodiment, an argon gas supplied by the diluent as source 228 flows at a rate of approximately 1000 sccm through the mixing block 210. The gas sources 227 and 229 are also prompted to flow H, and N, at approximately 1000 sccm and approximately 300 sccm, respectively. The gas mixture in the gas mixing block 210 is dispersed into the reaction chamber 217 by the showerhead 212. In one embodiment, the control system 234 also instructs the diluent gas source 228 to flow argon from the substrate heating source 214 to provide an edge purge at the surface interfacing the substrate 211. In particular, the control system 234 instructs the diluent gas source 228 to flow argon at a rate within the range of approximately 250 to 550 sccm.

A second nucleation film growth is performed in block 408 by flowing silanie as from a silane-containing as source 226 a t a first flow rate and tungsten n gas from a tungsten-containing as source 224 at a second flow rate, where the second flow rate is greater than the first flow rate, and for a period of time sufficient to deposit a second tungsten nucleation layer with the desired thickness. In particular, a as flow rate ratio of the first flow rate and the second flow rate is a value within the range of approximately 1:1.9 to 1:2.1. By way of example, the control system 234 instructs the silane-containing gas source 226 and the tungsten-containing as source 224 to flow $SiH_4$ and $WF_6$ at a ratio of approximately 1:2. For this particular embodiment, the control system 234 instructs the silane-containing gas source 226 to flow at a rate within the range of approximately 4 to 6 sccm of SiH, and the tungsten-containing, gas source 224 to flow at a rate within the range of approximately 8 to 12 sccm of $WF_6$.

Similar to the first nucleation film growth of block 406, the control system 234 further instructs the diluent gas source 228 to flow argon gas at a rate of approximately 1,000 sccm. In one embodiment, the control system 234 also instructs the diluent gas source 228 to flow argon from the substrate heating source 214 to provide an edge purge at the surface interfacing the substrate 211. In particular, the control system 234 instructs the diluent gas source 228 to flow argon at a rate within the range of approximately 250 to 550 sccm. The gas sources 227 and 229 are prompted to flow $H_2$ and $N_2$ at approximately 1,000 sccm and approximately 300 sccm, respectively.

The increased tungsten gas flow rate ratio of the second tungsten nucleation layer optimizes the overall nucleation film thickness. The period of time in which the control system 234 instructs the gas sources 224, 226, 227, 228, and 229 to flow varies depending on the target thickness of the nucleation film. In one embodiment, the second tungsten nucleation layer deposition of block 408 occurs for a period of time within approximately 19 to 29 seconds in order to obtain approximately 10 to 60 nm of the nucleation film. The particular range of thickness was determined to minimize the WF$_6$ reaction with the TiN liner material and to ensure complete coverage of the liner surface.

Forming the overall nucleation film thickness further requires achieving and maintaining a sufficiently low pressure in the reaction chamber 217 while executing the first nucleation film growth in block 406 and a second nucleation film growth in block 408. In one embodiment, the control system 234 instructs the vacuum pump 215 to pressurize the reaction chamber 217 at a pressure within the range of approximately 3 to 6 torr. In a more specific embodiment, the control system 234 instructs the vacuum pump 215 to pressurize the reaction chamber 217 at approximately 4.5 torr.

In block 410, a bulk layer of tungsten film is further deposited (bulk tungsten film deposition) by flowing a tungsten-rich gas mixture while maintaining a sufficient pressure. The control system 234 instructs the vacuum pump 215 to increase the pressure in the reaction chamber 217 to about 90 torr. The tungsten-containing as source 224 is prompted to flow WF$_6$ at a rate ranging within approximately 90 to 100 sccm. In addition, the gas source (H$_2$) 227 is instructed to flow within the range of approximately 1500 to 2100 sccm of H$_2$. The diluent as source 228 and the gas Source (N$_2$) 229 flow a Sufficient amount of gas mixture as described in the previous block 408. After a bulk layer of tungsten film with a desired thickness is created in block 410, the reaction chamber 217 is purged to atmospheric pressure in block 412 and the robotic lift 222 is prompted to lower the substrate heating source 214 alone with the substrate 211. The substrate 211 is removed from the reaction chamber 217 in block 414.

The resulting benefits of the present invention includes a significant reduction in sensitivity towards gas phase nucleation and an improvement in the nucleation step coverage resulting from the lower partial pressures of the process gases and slower deposition rates. The first nucleation film growth allows the seed layer to nucleate uniformly on all the Surfaces within the via and, therefore, covers up any region or location devoid of the TiN glue liner. The second nucleation film growth provides a more accurate controllability to optimize the overall nucleation film thickness. The step coverage for the 2-step nucleation tungsten via fill process is approximately 80%. Consequently, there is an improvement in the via fill characteristics.

In addition to the improved via fill characteristics, an approximately 20% decrease in contact resistance is attained. A significant reduction of the contact resistance from about 2.2 ohms to approximately 1.7 ohms is achieved by way of the present invention. The chain resistance between the zero level metal layer and the first level metal layer is also reduced from about 5 ohms to about 4 ohms.

The method of depositing a tungsten film in the application of achieving superior via fill according to the present invention can be utilized in the fabrication of various devices such as a Dynamic Random Access Memory (DRAM) or Logic applications. Further, the present invention has been described in one or more embodiments that are to be illustrative and not restrictive. It should also be apparent that such other alternatives, modifications and variations may be effected without departing from the spirit and scope of the present invention. By way of example, the present invention can be applied for developing interconnects or metal lines in which a low resistance of the material is desired. The scope of the invention should, therefore, be determined not with reference to the above descriptions, but instead to the appended claims.

We claim:

1. A method of depositing a tungsten film to a substrate in a reaction chamber, comprising:

heating the substrate by employing a substrate heating source;

flowing a silane gas mixture until a protective, amorphous silicon layer is formed on a surface of the substrate upon which the tungsten film is to be deposited;

executing a first nucleation film growth by flowing silane gas from a silane-containing gas source at a first flow rate and flowing tungsten gas from a tungsten-containing gas source at a second flow rate, where the first flow rate is greater than the second flow rate, and for a period of time sufficient to provide a first silane-rich nucleation layer;

executing a second nucleation film growth by flowing silane gas from a silane-containing gas source at a first flow rate and flowing tungsten gas from a tungsten-containing gas source at a second flow rate, where the second flow rate is greater than the first flow rate, and for a period of time sufficient to deposit a second tungsten nucleation layer with the desired thickness; and flowing a tungsten-rich gas mixture while maintaining a sufficient pressure until a bulk layer of tungsten film is deposited.

2. The method of claim 1, wherein a gas flow rate ratio of the first flow rate to the second flow rate is within a range of approximately 2:1 to approximately 7:1 during said executing the first nucleation film growth.

3. The method of claim 1, wherein a as flow rate ratio of the first flow rate to the second flow rate is within a range of approximately 1:1.9 to approximately 1:2.1 during said executing the second nucleation film growth.

4. The method of claim 1, further comprising:

maintaining a sufficiently low pressure in the reaction chamber while executing the first and second nucleation film growths.

5. The method of claim 4, wherein said sufficiently low pressure is a value within the range of approximately 3 torr to 6 torr.

6. The method of claim 1, wherein said heating the wafer substrate is performed at a temperature within the range of approximately 400 degrees Celsius to approximately 450 degrees Celsius.

7. The method of claim 1, wherein said flowing the silane gas mixture until a protective, amorphous silicon layer is formed further comprises applying pressure and ramping the pressure sequentially from approximately 4.5 torr to approximately 10 torr to approximately 30 torr.

8. The method of claim 7, wherein applying a pressure by sequentially ramping from approximately 4.5 torr to approximately 10 torr to approximately 30 torr is performed over a period of time of tree equivalent time segments.

9. The method of claim 7, wherein the period of time is within the range of approximately 15 to 20 seconds.

10. The method of claim 1, further comprising flowing argon gas from an argon gas source coupled to the substrate heating source at a flow rate within the range of approximately 250 to 550 sccm.

* * * * *

UNITED STATES PATENT AND TRADEMARK OFFICE
CERTIFICATE OF CORRECTION

PATENT NO.    : 6,309,966 B1           Page 1 of 1
DATED         : October 30, 2001
INVENTOR(S)   : Shrinivas Govindarajan et al.

It is certified that error appears in the above-identified patent and that said Letters Patent is hereby corrected as shown below:

Column 8,
Line 37, delete "as" and insert therefor -- gas --.
Line 59, delete "tree" and insert therefor -- three --.

Signed and Sealed this

Eleventh Day of March, 2003

JAMES E. ROGAN
*Director of the United States Patent and Trademark Office*